United States Patent [19]

Calviello

[11] Patent Number: 4,620,207

[45] Date of Patent: Oct. 28, 1986

[54] EDGE CHANNEL FET

[75] Inventor: Joseph A. Calviello, Kings Park, N.Y.

[73] Assignee: Eaton Corporation, Cleveland, Ohio

[21] Appl. No.: 683,722

[22] Filed: Dec. 19, 1984

[51] Int. Cl.[4] .............................................. H01L 49/02
[52] U.S. Cl. ......................................... 357/22; 357/15; 357/56; 357/4
[58] Field of Search ........................... 357/22, 56, 15, 4

[56] References Cited

U.S. PATENT DOCUMENTS

| | | | |
|---|---|---|---|
| 3,893,155 | 7/1975 | Ogiue | 357/4 |
| 4,007,297 | 2/1977 | Robinson et al. | 357/4 |
| 4,098,921 | 7/1978 | Calviello | 357/15 |
| 4,212,022 | 7/1980 | Beneking | 357/22 |
| 4,466,008 | 8/1984 | Beneking | 357/15 |
| 4,543,320 | 9/1985 | Vijan | 357/23.7 |
| 4,547,789 | 10/1985 | Cannella et al. | 357/23.7 |

FOREIGN PATENT DOCUMENTS

| | | | |
|---|---|---|---|
| 0145567 | 6/1985 | European Pat. Off. | 357/22 |
| 2335799(A) | 2/1974 | Fed. Rep. of Germany | 357/22 |

Primary Examiner—Martin H. Edlow
Attorney, Agent, or Firm—Andrus, Sceales, Starke & Sawall

[57] ABSTRACT

Edge channel FET structural geometry and processing is disclosed. A plurality of mesa stacked horizontal layers are provided including source and drain semiconductor layers (74, 76) separated by an insulator layer (75) and having exposed edges (78, 80) at a generally vertical side (83) of the mesa. A generally vertical semiconductor layer (84) extends along the side of the mesa over the exposed source and drain layer edges and forms a channel (93). A gate layer (91, 92) on the channel controls depletion region spreading in the channel layer to control conduction therethrough between the source and drain layers. Channel length is extremely small, as low as 0.1 micron. Ohmic contacts (87, 90) to the source and drain layers are defined several microns away from the conducting channel, resulting in considerable reduction in fabrication complexity, as well as improved reliability. Fabrication and alignment of the gate to the active channel layer is simplified.

13 Claims, 19 Drawing Figures

EDGE CHANNEL FET

BACKGROUND

The invention relates to field effect transistors, FETs, particularly those capable of operation at microwave and millimeter wave frequencies.

Electrical performance of a semiconductor device is dependent upon structural configuration and the ability of the structure to reduce elemental parasitics such as series resistance, shunt capacitance and series inductance. Reliability is dependent upon the metallurgical techniques used to provide the junction passivation and to produce ohmic and schottky contacts.

Although the last decade has seen substantial progress in the development and fabrication of FET devices that provide excellent performance and reliability, there remains a need for further development in devices intended for application in the millimeter wave frequency range.

Figure 1:
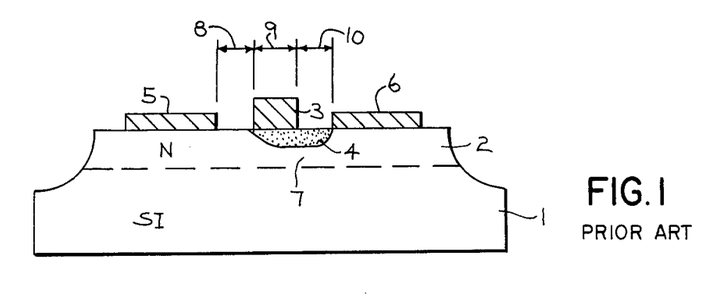
FIG. 1 is a sectional view of a known basic conventional FET.

FIG. 1 shows known conventional FET structure fabricated on semi-insulating or dielectric substrate 1 and active epitaxial N layer 2. Such substrates are typically made of gallium arsenide Gate 3 controls spreading of depletion region 4 which in turn controls conduction between source 5 and drain 6 by pinching off or opening channel 7. Dimension 8 is the source to gate length Lsg. Dimension 9 is the gate length Lg. Dimension 10 is the gate to drain length Lgd. Ohmic contacts are made by sinter alloying a metallic film composed of nickel-germanium gold to the active layer 2. The nickel-germanium gold usually ranges between 500 and 1,000 angstroms in thickness, and is typically composed of 12 percent germanium or nickel germanium and 88 percent gold. Using this contact composition, a contact resistivity ranging from 3 to $5 \times 10^{-6}$ ohms cm$^{-3}$ can be achieved. The input series resistance can be in the 3 to 5 ohm range if the concentration of active N layer 102 ranges from 1 to $3 \times 10^{17}$ cm$^{-3}$, and the source ohmic contact is positioned within 1 micron of the gate edge.

For the configuration in FIG. 1, the minimum input source series resistance that can be achieved is limited by the finite source to gate length Lsg of the conducting channel. For some low noise and low power applications, this channel length has been reduced to 0.5 microns. However, the reliability and yield of such devices is poor since gold and nickel can easily interdiffuse with gallium arsenide and eventually diffuse into the active conducting channel, resulting in performance degradation and ultimately catastrophic failure. An additional limitation of the structure is the effective length of the channel under the gate which is much greater than the metallurgical gate length, resulting in greater effective source to gate capacitance and consequently a lower maximum frequency of oscillation. Furthermore, the conducting channel is fully exposed to ambient and to contaminants that contribute to poor RF performance and reliability.

To improve reliability, various dielectric layers, such as silicon dioxide $SiO_2$ and silicon nitride $Si_3N_4$ have been used to passivate the exposed conducting channel. $SiO_2$ is known to be ineffective as a passivation for sodium ions, the most notably troublesome contaminant. On the other hand, $Si_3N_4$ is an effective passivation only for sodium ions. In order to provide a complete passivation, both $SiO_2$ and $Si_3N_4$ must be used. For conventional FETs, the use of these dielectrics often increases the parasitic capacitance between the source and gate Csg, between gate and drain Cgd, and between source and drain Csd. These added parasitic capacitances effectively limit the efficient operation of conventional FETs to well below 20 GHz.

Figure 2:
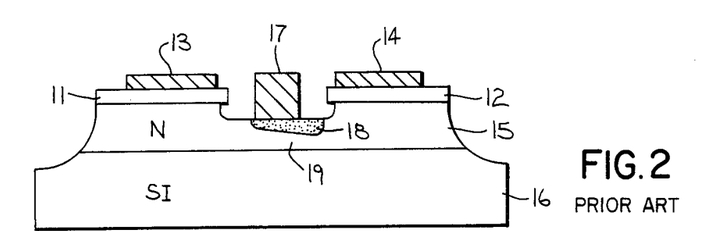
FIG. 2 is a sectional view of a known FET incorporating an improvement over the basic FET of FIG. 1.
Figure 3:
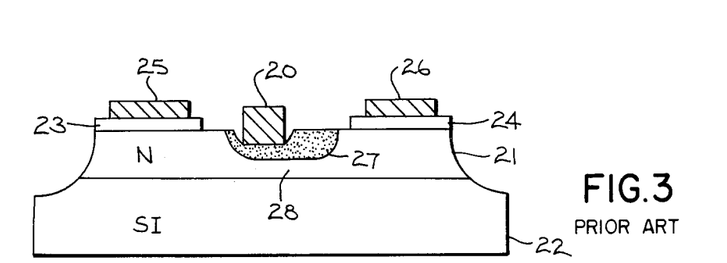
FIG. 3 is a sectional view of a known FET incorporating an additional improvement over the basic FET of FIG. 1.

FIG. 2 shows another known FET configuration, developed to improve the performance of the structure of FIG. 1. N+ expitaxial layers 11 and 12 are provided beneath source and drain contacts 13 and 14 on N layer 5 on semi-insulating or dielectric substrate 16. Gate 7 controls spreading of depletion region 18 to control conduction through channel 19. In the known configuration of FIG. 3 gate 20 is recessed in N layer 21, with the remaining structure being comparable to FIG. 2 with substrate 22, N+ epitaxial layers 23 and 24, source and drain contacts 25 and 26, depletion region 27 and channel 28. The quality of the epitaxial layers 11, 12 and 23, 24 in FIGS. 2 and 3 is difficult to evaluate. In addition, the fabrication steps are more complex and result in poor device yield and uniformity.

The structures of FIGS. 2 and 3 do, however, offer advantages over the structure of FIG. 1, including the ability to achieve lower contact series resistance, lower channel resistance and higher voltage breakdown. The lower contact resistance is achieved by using a highly doped N+ layer with a doping concentration of approximately $2 \times 10^{18}$ cm$^{-3}$. The lower channel resistance is achieved by using a thicker active N layer outside the gate region where a recessed gate is employed as shown in FIG. 3. A higher voltage breakdown is achieved by providing a greater separation between the gate and drain. In addition, the N+ layer can be extended close to the gate to further reduce the parasitic series resistance of the source and drain.

Although some improvement in electrical performance is attained by the structures shown in FIGS. 2 and 3, the degree of such improvement is still not adequate. Furthermore, there is no appreciable improvement in reliability over the structure of FIG. 1. The structures of FIGS. 2 and 3 are similar to that of FIG. 1 in that the channel is exposed to ambient and contaminants, the ohmic contact to the source is still within 1 micron of the gate, and the effective gate length is greater than the metallurgical length of the gate.

Figure 4:
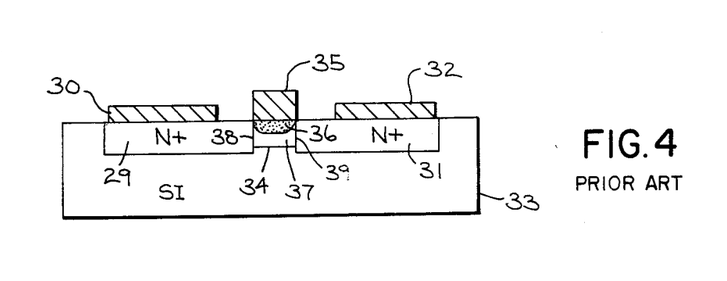
FIG. 4 is a sectional view of a known FET developed for low power, high speed logic applications.

FIG. 4 shows another known FET structure, developed for low power, high speed logic applications. This device is similar to that of FIG. 1 except that there is a first N+ layer 29 under source 30 and a second N+ layer 31 under drain 32. The remaining structure is comparable, with substrate 33, N layer 34, gate 35, depletion region 36 and channel 37. N+ layers 29 and 31 in FIG. 4 differ from N+ layers 11, 12 and 23, 24 in FIGS. 2 and 3 in that layers 29 and 30 extend up to the gate region rather than being confined to the areas immediately below the source and drain. Layers 29 and 31 occupy the area which is occupied by the N layer 15 in FIG. 2 and 21 in FIG. 3 except for the small segment lying directly below gate 35. For low power, high speed logic devices, the required voltage breakdown at 10 microamps is typically in the 3 to 5 volt range. The structure of FIG. 4 makes use of ion implantation to implant the N+ layers into semi-insulating or dielectric substrate 33. To achieve low series resistance, the gate is formed prior to the ion implantation and acts as a mask during the processs. The vertical facing edges 38 and 39 of N+ layers 29 and 31 are colinear with the edge of gate 35, thereby providing the desired lower series resistance. Ohmic contacts of nickel germanium gold are then formed on the implanted N+ layers at 30 and 32.

Although the series resistance of the device of FIG. 4 is reduced as compared to the devices of FIGS. 1–3, voltage breakdown and reliability are also reduced. The voltage breakdown that can be achieved depends upon the carrier concentration of the N+ layers and upon the separation between the edges of the N+ layers and the gate. If the N+ layers are doped with a concentration of $10^{19} cm^{-3}$, the expected voltage breakdown at 10 microamps is well below 1 volt, making the device unreliable and difficult to fabricate. Another factor detracting from reliabilty of the device of FIG. 4 is that it must be annealed at about 900° C. following the ion implantation process. At this temperature, the gate metal tends to interdiffuse with the N+ layer about its edges, to form an ohmic contact or a short circuit.

Figure 5:
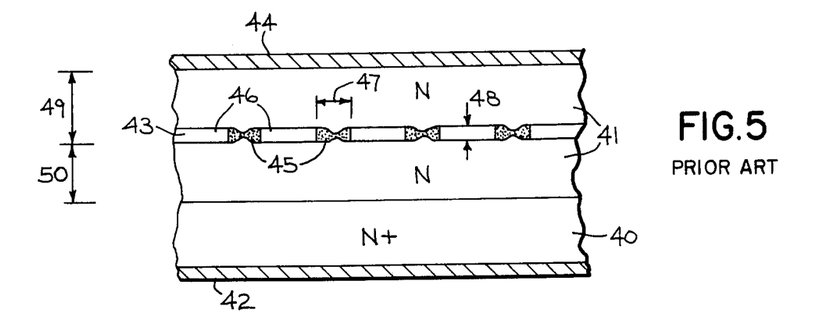
FIG. 5 is a sectional view of a known permeable base FET.

FIG. 5 shows another known FET configuration, generally referred to as a permeable base transistor PBT, and is a normally OFF device developed to extend the operating frequency range of FETs into the millimeter region. The device includes an N+ layer 40, an N layer 41, a source 42, a gate 43, a drain 44 and depletion regions 45. FIG. 5 shows a cross sectional view with gate 43 extending centrally through N layer 41 and divided into a series of fingers such as 46 between which are the depletion layers 45. The carrier doping concentration of N layer 41 is about $1 \times 10^{16}$ $cm^{-3}$ in order to fully deplete the regions 45 between adjacent gate fingers at zero bias. Dimension 47 is less than the width of the depletion region pair at zero bias. Dimension 48, the thickness of the gate finger, can be less than 500 angstroms. For a doping concentration in the N layer of $1 \times 10^{16} cm^{-3}$, a dimension 47 of about 2,000 angstroms, a distance from the gate to the drain, dimension 49, of 0.6 microns, a distance from the gate to source, dimension 50, of 0.4 microns, and a gate length Lg, dimension 48, of 200 angstroms, the calculated power delay product is nearly $1 \times 10^{-15}$ joules, the maximum unity gain frequency is in excess of 200 gigahertz, and the minimum frequency of oscillation is nearly 1,000 gigahertz.

Fabrication of the structure of FIG. 5 is extremely difficult. In particular, it requires the growth of a single crystal epitaxial layer at the edges and over the amorphous metal fingers of the gate. To achieve short gate lengths, the gate metal must be made very thin, increasing the gate resistance to an intolerably high value. To achieve a fully depleted layer, the value of the carrier concentration is reduced by an order of magnitude from $1 \times 10^{17} cm^{-3}$ for a conventional FET to $1 \times 10^{16} cm^{-3}$, producing an increase in the resistivity of the epilayer. Although the PBT structure of FIG. 5 has been fabricated, the experimental results to date have not been encouraging. The best performance obtained with these devices thus far only approaches that achieved with conventional devices at frequencies well below 20 gigahertz.

The goal in the development of the above conventional and PBT FET structures was to increase the maximum oscillating frequency, lower the noise figures where the application was low noise amplifiers, increase the power output where the application was power amplifiers, and increase the switching speed where the application was gigabit logic circuitry. The predicted maximum frequency of oscillation for conventional devices is 120 to 140 gigahertz. This limitation is attributed to the finite parasitic series resistance of the N layer beneath the source, and the length of the depletion layer beneath the gate, which is larger than the physical length of the gate material. This makes the effective gate capacitance greater than that calculated from the physical dimensions of the gate and accordingly limits the operation of the device to lower frequencies.

Figure 6:
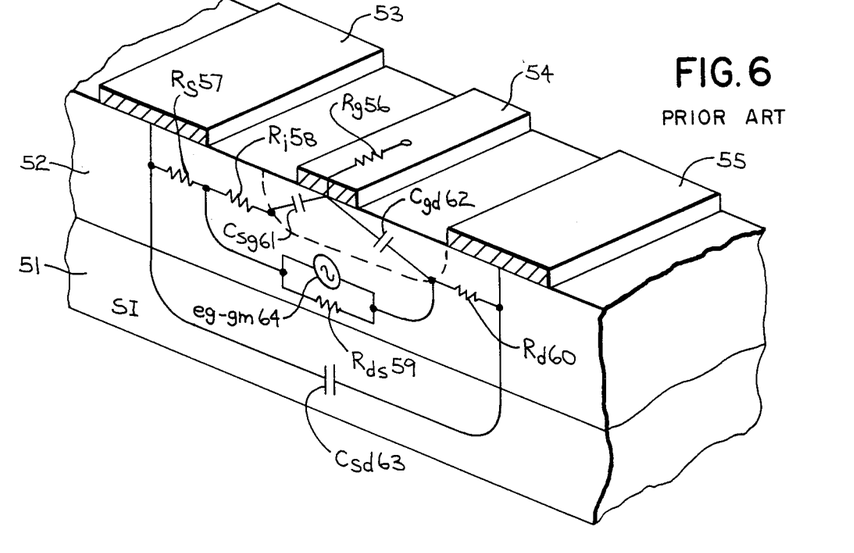
FIG. 6 is a cut-away perspective view of known conventional FET structure.
Figure 7:
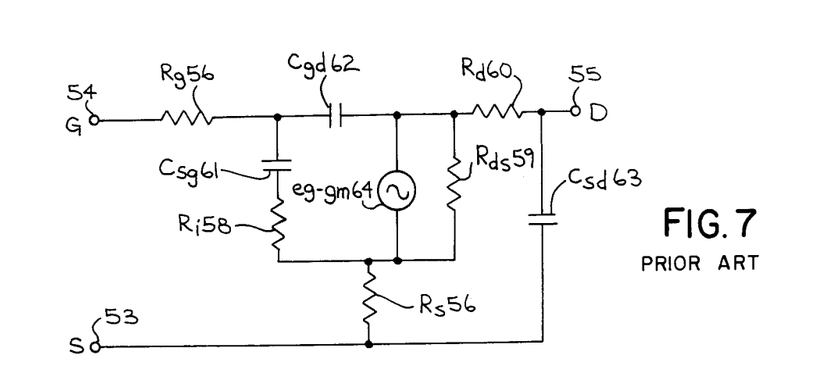
FIG. 7 shows the equivalent electrical circuit of the structure of FIG. 6.

FIG. 6 is a schematic perspective cut-away view of conventional FET structure, and FIG. 7 shows the equivalent electrical circuit. The device includes a semi-insulating dielectric substrate 51, N layer 52, source 53, gate 54 and drain 55. The corresponding equivalent electrical circuit includes gate resistance Rg 56, source resistance Rs 57, intrinsic channel resistance Ri 58, drain to source resistance Rds 59, drain resistance Rd 60, source to gate capacitance Csg 61, gate to drain capacitance Cgd 62, source to drain capacitance Csd 63, and a current generator eg-gm 64 which produces a current equal to the gate voltage eg multipled by the transconductance gm. For the circuit of FIGS. 6 and 7, the maximum frequency of oscillation fm is given by:

$$fm = \frac{f_T}{2(T_1 + T_3 f_T)^{\frac{1}{2}}}$$

where the frequency at unity gain $f_T$ is given by $$f_T = (\tfrac{1}{2}\pi) \frac{gm}{C_{gs}},$$

and gm is the transconductance $$T_1 = \frac{Rg + Ri + Rs}{R_{ds}}$$

and $$T_3 = 2\pi Rg C_{dg}$$

As indicated in the above equations, to achieve a high maximum frequency of oscillation, it is necessary to maximize $f_T$. This is realized by decreasing the gate to source capacitance Cgs, the gate to drain capacitance Cgd, the parasitic source resistance Rs, the gate resistance Rg, the intrinsic channel resistance Ri, and by increasing the transconductance gm.

The value of Rs generally cannot be reduced below 1 ohm when using conventional FET structures designed for use in low noise or power application. Rs and Ri can be somewhat reduced by increasing the carrier concentration in the active N layer. However, this results in the gate to drain voltage breakdown also being reduced.

SUMMARY

It is an object of the present invention to provide a field effect transistor which overcomes the fabrication and yield difficulties noted above, and to provide a high performance and highly reliable field effect transistor capable of operating in the millimeter wave range. The present invention affords a field effect transistor structure capable of modification to provide devices for low noise amplifier, power amplifier and high speed logic applications. Field effect transistor structure in accordance with the invention exhibits extremely low parasitic input series resistance, reduced skin effect losses, enhanced mobility via ballistic transport low channel resistance, reduced effective gate length, a protected buried channel, and diffusion barriers for the source and drain.

In the present invention, the source series resistance may be essentially eliminated by placing the source contact electrode directly below a schottky gate. The source and drain are separated by a semi-insulating or dielectric epitaxial layer, and the drain in the preferred embodiment lies above the source. An epitaxial N layer, covering the source and drain, is grown at a generally vertical side of a mesa that exposes the edge of the source and drain layers. A gate electrode is on the outer surface of the epitaxial N layer. The dielectric layer separating the source and drain may be adjusted in thickness to 1 micron or less for low noise and high speed devices, and several microns for higher power devices.

In the preferred species of the invention, the source and drain regions are composed of very highly doped layers with doping concentrations ranging from $5 \times 10^{18}$ to $5 \times 10^{19} cm^{-3}$. Using these very highly doped layers and refractory metal contacts with a gold overlayer, it is possible to achieve very low resistivity ohmic contact to the source and drain that may be located only several microns away from the junction. The high doping concentrations make possible low resistance ohmic contacts despite the use of refractory metals, while the refractory metals function as diffusion shields permitting the use of gold overlayers close to the junction without degradation otherwise due to gold interdiffusion. The result of the structural geometry of the present invention is improved reliability provided by the diffusion shields and improved RF performance provided by the reduction in resistance.

By making the separation between the source and drain 1 micron and by placing a source N++ region directly below the gate, the resulting effective gate length is less than that of the noted conventional FETs. This feature combined with the near zero source series resistance results in an electron velocity overshoot of $4 \times 10^7$ volts per centimeter instead of $1 \times 10^7$ volts per centimeter, increasing the maximum frequency of oscillation well above 500 gigahertz, and providing a power delay product in the low $1 \times 10^{-15}$ joules and noise figures below 3 dB at 50 gigahertz.

In various species of the invention, the conducting channel lies within a semiconductor active N layer and below a semi-insulating or dielectric layer, whereby it is protected from ambient and contamination. In addition, leakage current between the source and gate and between the gate and drain is drastically reduced.

The structural geometry of the present invention is essentially planar and therefore applicable to monolithic integrated circuits. The use of thick (greater than or equal to 1 micron) and heavily doped (1 to $5 \times 10^{19} cm^{-3}$) layers reduces the losses due to skin effect, permitting high performance in the microwave to millimeter wavelength region.

BRIEF DESCRIPTION OF THE DRAWINGS

Prior Art

Present Invention

DETAILED DESCRIPTION OF THE INVENTION

The present invention provides an edge channel field effect transistor, various species of which are shown in FIGS. 8–15. The intrinsic and extrinsic elemental values associated with the preferred species of the present invention differ from that of FIGS. 6 and 7 in that the source series resistance is substantially zero, the value of the channel resistance is at least a factor of 3 lower when the drain and source are separated by 1 micron and a factor of 6 lower when the separation is 0.5 microns, and the gate resistance is proportionally reduced by the ratio $1/n^2$ where n is the gate finger number, as well as by the fact that gate finger length can be less than 3 microns. In addition, the source to gate capacitance is also reduced because the gate is placed directly over the source, thus reducing the spreading of the depletion region which is inherent in the noted prior conventional planar structures.

Figure 8:
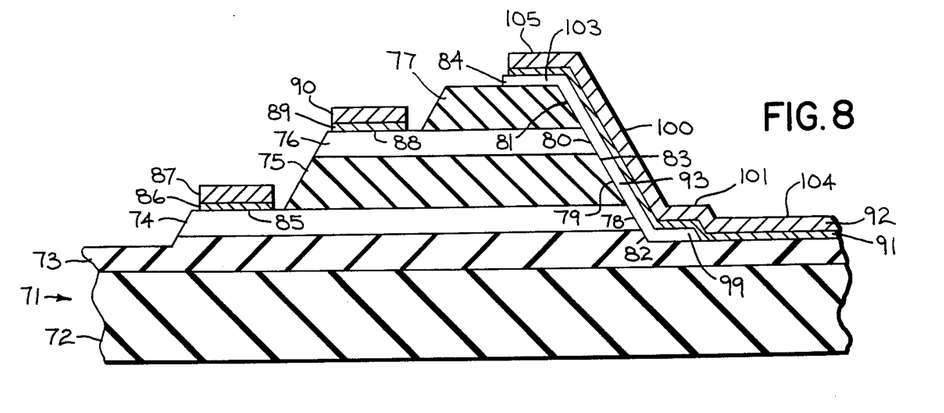
FIG. 8 is a sectional view of FET structural geometry in accordance with the invention.

FIG. 8 shows a substrate 71 of electrically insulating material, such as dielectric material or semiconductor material doped to a semi-insulating condition. Insulator substrate 71 may include a base layer 72 and a top buffer layer 73. An epitaxial highly doped N++ source layer 74 is on the upper surface of substrate 71. Epitaxial insulator layer 75 is on the upper surface on semiconductor layer 74. Epitaxial N++ drain layer 76 is on the upper surface of insulator layer 75. Epitaxial insulator layer 77 is on the upper surface of semiconductor layer 76. Layers 74–77 are deposited sequentially in situ, providing a mesa stacked structure. The mesa is etched, which processing is described more fully hereinafter in conjunction with FIGS. 16-19, which exposes the edges 78-81 of the epitaxial layers and an edge 82 of substrate 71 along a side 83 of the mesa. An active N layer 84 is epitaxially grown along the side 83 of the mesa covering edges 78–82.

Horizontal layers 75–77 are selectively etched away such that horizontal layer 74 extends horizontally beyond layers 75 and 76 to form an upper surface contact area 85 for receiving a source contact formed by a thin layer of refractory metal 86 and an overlay of gold 87. Layer 77 is etched away such that layer 76 extends horizontally therebeyond to provide an upper surface contact area 88 for receiving a drain contact formed by a thin layer of refractory metal 89 and an overlay of gold 90.

On the active N layer 84, a gate is formed by a thin refractory metal layer 91 and an overlayer of gold 92. N layer 84 and mesa side 83 extend generally vertically, for example 90° to the horizontal or along the 111 plane as shown in FIG. 8. Gate 92 controls depletion region spreading in channel layer 84 which in turn controls conduction between source 74 and drain 76 through channel layer 84. Channel length is determined by the thickness of dielectric layer 75 along the plane of mesa side 83.

Figure 9:
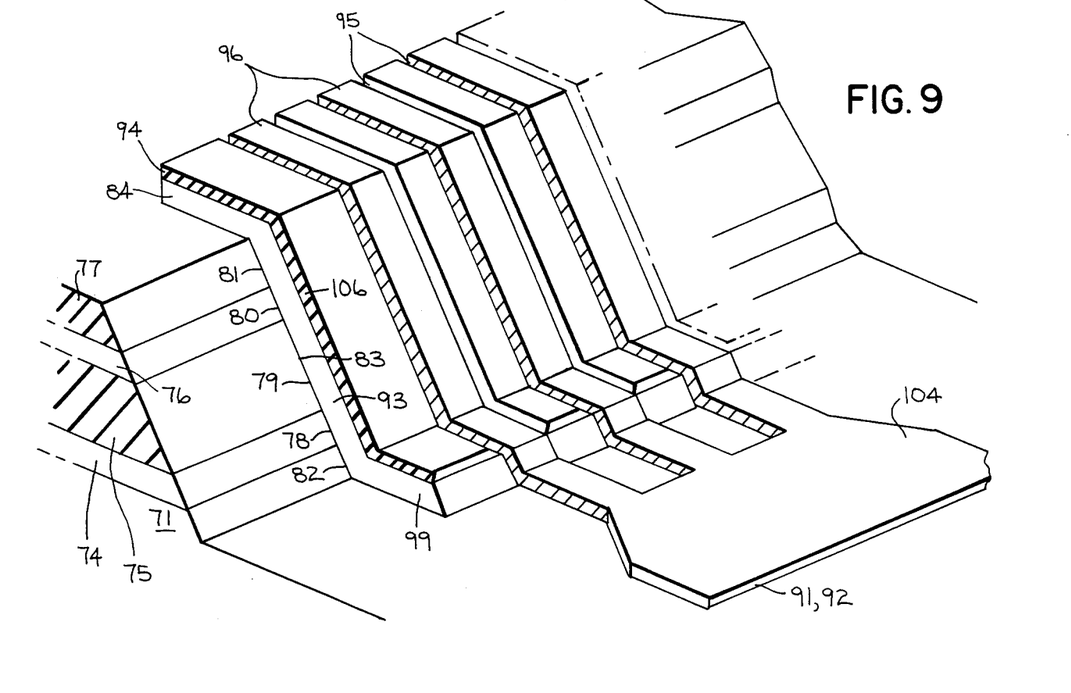
FIG. 9 is a top perspective view of FET structure in accordance with the invention showing a species with a recessed gate and a dielectric or semi-insulating layer above an epitaxial N channel layer for passivation purposes.
Figure 10:
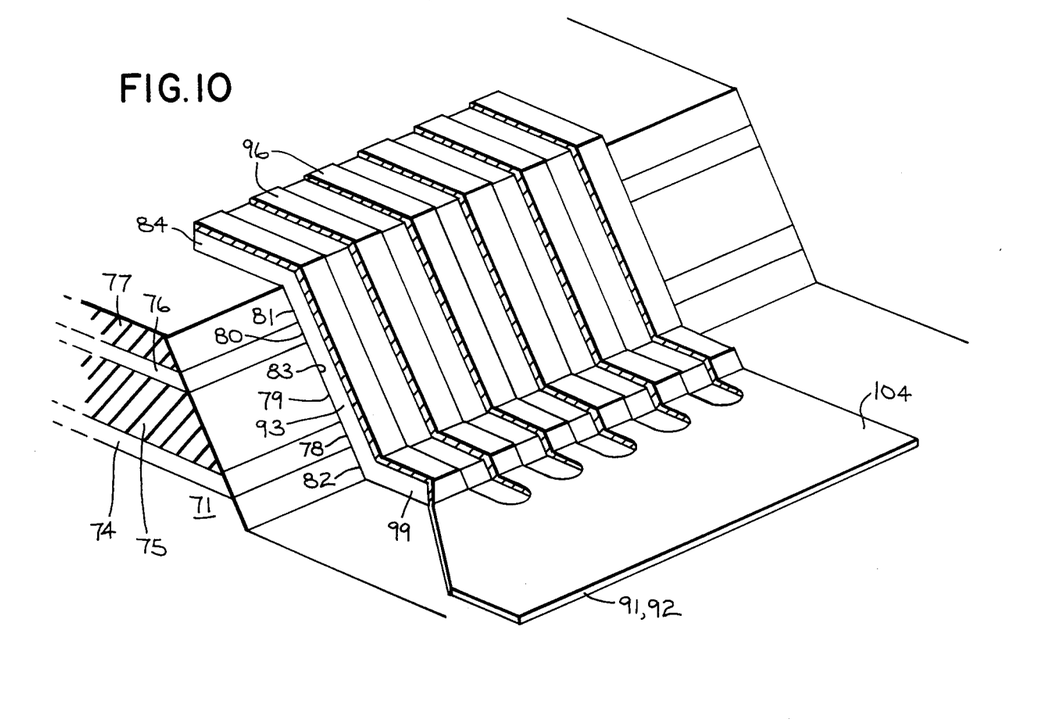
FIG. 10 is a top perspective view of a species of FET structure in accordance with the invention wherein gate fingers extend the full length of the mesa side and are spaced to deplete the full surface of an N channel layer to afford a normally OFF FET.
Figure 11:
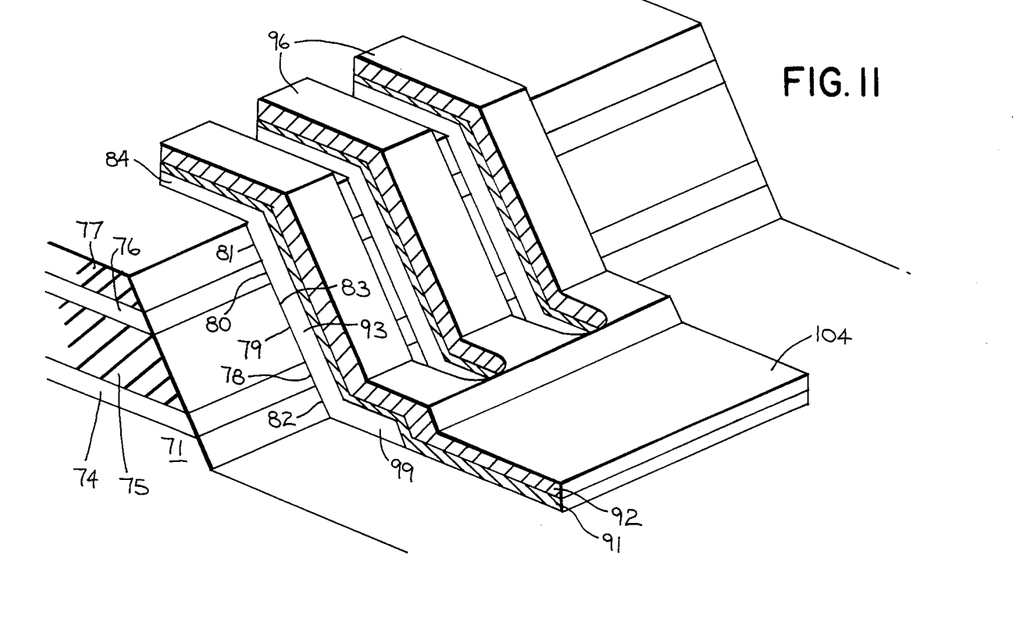
FIG. 11 is a top perspective view of a species of FET structure in accordance with the invention wherein an N channel layer between gate fingers is etched to operate in a depletion mode and afford a normally ON FET.
Figure 12:
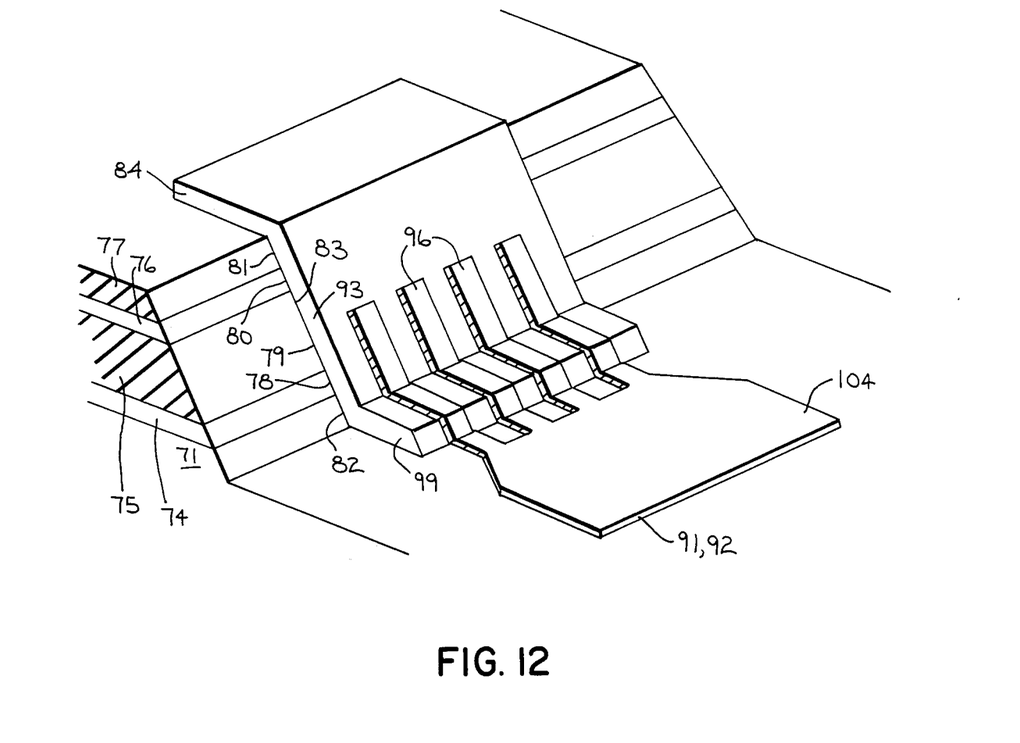
FIG. 12 is a top perspective view of a species of FET structure in accordance with the invention wherein gate fingers extend only over the source region.
Figure 13:
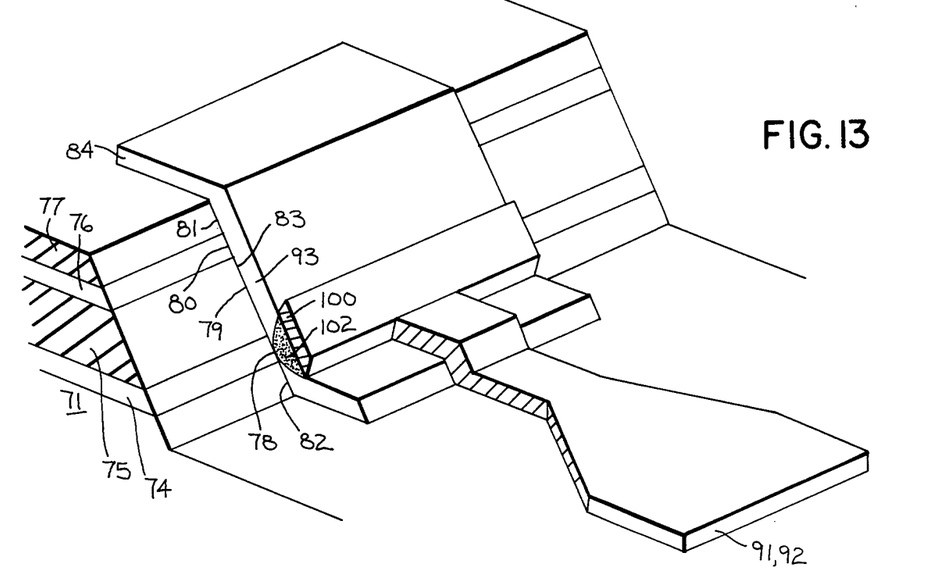
FIG. 13 is a top perspective view of a species of FET structure in accordance with the invention wherein the gate extends along the full width of an N channel layer and directly above an N++ source layer.
Figure 14:
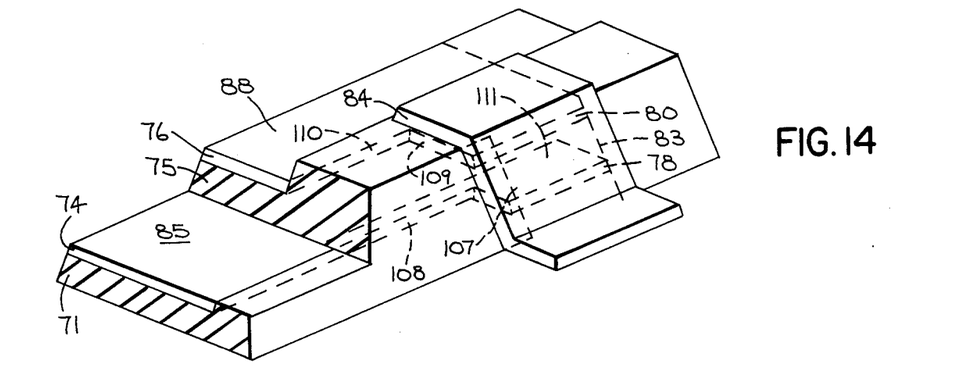
FIG. 14 is a top perspective view of a species of FET structure in accordance with the invention with laterally offset nonoverlapping source and drain layers having geometries designed for minimum source to drain capacitance.

FIGS. 9-19 use the same reference characters as FIG. 8 where appropriate to facilitate clarity. The gate electrode such as 92, which may also include refractory metal such as 91, contacts the N layer 84 and is located directly above the source and drain as shown in FIGS. 8-11, or over the source and a portion of the channel 93 as shown in FIG. 12, or only over the source as shown in FIG. 13. It is to be noted that the stringent requirement for aligning the gate, source and drain in the above noted conventional FETs is elminated by the particularly simple and effective structure shown. FIG. 9 shows a passivating insulator layer 94 epitaxially grown on N layer 84 and having portions etched to form recessed channel-receiving sections such as 95 for receiving a plurality of gate fingers such as 96, for example for formation of gate schottky junctions to N layer 84, to be described more fully hereinafter. FIG. 14 shows source and drain layers 74 and 76 shaped by selective growth or implantation to certain geometrical configurations in order to reduce source to drain capacitance, as more fully described hereinafter.

The equivalent electrical circuits for the above noted conventional FETs and for the preferred species of the present edge channel FET are the same. However, the values of the intrinsic and extrinsic elements are significantly different. In particular, the magnitude of Rs is drastically reduced and is essentially zero. Depending on device application, Rs may be a factor of 10 lower than that realizable in the noted conventional devices. As can be seen in FIG. 8, Rs is essentially determined by the bulk resistance of N++ layer 74. By keeping the width of the source in the 20 to 100 micron range and its thickness near 1 micron, the value of Rs can be less than 0.1 ohm, assuming an N++ carrier concentration of $5\times10^{19}$ cm$^{-3}$. The values of Rd, Ri, Cgs, Rds, Cdg and Csd are also reduced. The magnitude of each depends upon the particular application and frequency of operation. For example, in high speed logic application, where the required voltage breakdown is only in the 2 to 5 volt range, the source to drain separation can be in the 0.2 to 1 micron range, and the gate finger width in the 0.5 to 1.0 micron range. The length of the gate fingers is proportional to the mesa height which can be in the 2 to 3 micron range. For low noise devices, where the voltage breakdown should be in the 8 to 15 volt range, the source to drain spacing can be in the 1 to 2 micron range, the gate finger width in the 0.5 to 1 micron range, and the gate finger length near 4 microns when operating in the 20 to 50 gigahertz and above frequency range. For higher power application such as 1 watt or above where the required voltage breakdown is in excess of 20 volts, the source to drain separation should be greater than 5 microns and the total gate width should be near or above 3 millimeters, with each gate finger with near 1 to 1.5 microns, for 12 gigahertz and less than 1 micron at 20 gigahertz and above.

Since the effective gate length is shorter in the edge channel FET of the present invention than in the above noted conventional devices, the gate length necessary for high RF performance at 12 gigahertz and above is no longer a stringent requirement. For example, the performance obtained with the edge channel FET structure of the present invention having a 1 micron gate length is superior to that of the above noted conventional structure having a 0.5 micron gate length.

In the edge channel FET configuration of the present invention, the leakage current is lower than in the above noted conventional devices, and thus bulk breakdown is achieved. This feature and the edge geometry configuration make it possible to reduce the source to drain separation and to further reduce the value of Rd.

Edge channel FET structure in accordance with the invention has elemental values which are considerably less, for example 30 to 50 percent, than those realizable with the above noted conventional FETs. Furthermore, the edge channel FET structure in accordance with the invention has superior RF performance in the microwave to millimeter wavelength range.

In addition to the above advantages, the present structure enables reduction of losses due to skin effect. This is achieved by making the thickness of the N++ layers equal to or greater than the skin depth at the operating frequency. For example, for a 50 gigahertz device, the skin depth in the N++ layers, having doping concentration of $5\times10^{19}$cm$^{-3}$, is 3 microns. Using the edge channel FET structure in accordance with the invention, this layer thickness and concentration can be easily achieved by molecular beam epitaxy and still maintain an almost planar device. In the above noted conventional FETs, it is not possible to make an N+ layer greater than 0.5 microns and still fabricate a FET having a micron or submicron gate length or a channel with a recessed gate.

Another significant feature of the edge channel FET structure of the invention is that the complete surface of the active N layer 84 can be passivated with $SiO_2$ and $Si_3N_4$ and native oxide, gallium oxide, without affecting the inter-electrode capacitances Csg, Cdg and Csd.

Since heavily doped N++ layers are being used for the source and drain, a low resistivity ohmic contact can be made using a thin layer of refractory metal such as tantalum, molybdenum or tungsten, and a thick overlayer of gold to replace the more typical nickel germanium gold which otherwise would require high temperature sinter alloying and can easily give rise to the above noted gold migration failure. A desirable benefit from the use of refractory metal as the contact is its gold diffusion barrier characteristic. The same metallurgy may be used for the gate, drain and source contact, and these electrodes may be simultaneously produced in a single step, substantially reducing fabrication cost and also improving yield. Since an ohmic contact which incorporates a diffusion barrer is utilized, the power handling capability and device reliability are improved. A further improvement in reliability is realized because the ohmic contacts to the heavily doped N++ layers can be defined several microns, e.g., 10 to 15 microns, from the junction without essentially increasing the value of Rd and Rs.

Edge channel FET structure in accordance with the invention reduces the parasitic elemental values. The inter-electrode spacing makes it possible to obtain electron velocity overshoot and thus achieve drift velocities near $4 \times 10^7$ volts per centimeter, as compared to $1 \times 10^7$ volts per centimter for the above noted conventional FETs. Thus, it is possible to fabricate devices with improved performance capable of operating higher into the millimeter wavelength and to achieve higher speed, lower delay power product, than previous structures.

The mean free electron path length between polar optical phonon emission in gallium arsenide range from 0.1 microns at electron energy of 0.05 electron volts to 0.2 microns at 0.5 electron volts. The absorption of such phonons is only about 25 percent of probable emissions at 350° K. The electron path length is decreased by the polar optical phonon energy during collision. The deflection angle ranges from 5°0 to 10° from the precollision direction. Thus, to a first order approximation, the electrons are ballistic in their motion, meaning that the electron velocity is a result of a potential drop within a short distance. To second order approximation, there is a small loss in energy at the direction cosine of the velocity. In gallium arsenide devices where the dimensions are only a few microns in length, there is insufficient ballistic or directed electron motion to be observed in the voltage-current characteristic. However, dimensions less than 1 micron in length will show significant effects, including electron velocity overshoot. In a short length, the electrons suffer only a slight velocity undershoot below pure ballistic transport motion. In N type gallium arsenide material with a length of approximately 0.5 microns, ballistic electrons accelerate to the theoretically predicted velocity determined by the applied potential in a fraction of the device length and then drift at this velocity the rest of the length. Edge channel FET structure in accordance with the invention is particularly suitable for the fabrication of ballistic transport devices intended for special applications, including high speed logic devices having source to drain separation near or below 0.5 microns.

FIGS. 16–19 show fabrication processing steps for the edge channel FET structure of FIGS. 8–13, and like reference numerals as in FIG. 8 are used where appropriate to facilitate clarity. Starting with insulator substrate 72 in FIG. 16, there is grown sequentially in situ thereon insulator buffer layer 73, N++ layer 74, insulator layer 75, N++ layer 76 and insulator layer 77. A mesa is defined, FIG. 17, with sides 97 and 83 and top 98, and of a height chosen to expose all the edges 78–82 of the epitaxially grown layers. Active N channel layer 84 is epitaxially grown over the mesa, covering the full surface thereof including the top 98 and both sides 97 and 83, FIG. 18. The upper surface contact areas 85 and 88 on respective layers 74 and 76 are photolithographically defined and etched, FIG. 19, by chemical or other suitable means. Schottky refractory metal 91 and gold overlayer 92 are deposited using chemical or reactive sputter etching to yield the structure shown in FIG. 8 and define desired contact patterns for source, drain and gate.

The invention thus provides a field effect transistor comprising a plurality of mesa stacked horizontal layers including source and drain semiconductor layers such as 74 and 76 separated by an insulator layer 75 and having exposed edges 78 and 80 at a generally vertical side 83 of the mesa. The vertical side may be 90° to the horizontal or at an angle thereto such as the 111 plane. A generally vertical semiconductor layer 84 extends along the side 83 of the mesa and forms a channel 93 over exposed edges 78 and 80. A gate layer 92 on channel layer 84 controls depletion region spreading in channel 93 to control conduction therethrough between source and drain layers 74 and 76.

One of the source and drain layers, such as source layer 74, extends horizontally beyond the other, as shown by the leftward extension in FIG. 8. Laterally offset source and drain electrode layers 86, 87 and 89, 90 are on the upper surfaces 85 and 88 of respective source and drain layers 74 and 76. Source and drain electrode layers 86, 87 and 89, 90 are at different vertical heights spaced by the thickness of dielectric layer 75 and drain layer 76.

Channel layer 84 has a generally horizontal section 99 on the substrate adjacent semiconductor layer 74. Gate layer 91, 92 has a generally vertical section 100 on at least a portion of the vertical section 93 of semiconductor layer 84 over layer 74. Gate layer 91, 92 has a generally horizontal section 101 on horizontal section 99 of layer 84.

In the species in FIG. 13, the generally vertical section 100 of gate layer 92 extends only over semiconductor layer 74 and depletion region 102 is shown therebelow.

In the species in FIGS. 8–11, vertical section 100 of the gate layer extends upwardly along the entire side of the mesa. As shown in FIG. 8, semiconductor layer 84 has a second generally horizontal section 103 on the upper surface of insulator layer 77 on top of the mesa. Gate layer 91, 92 has a second generally horizontal section 104 on substrate 71, and the generally vertical section 100 of the gate layer extends upwardly over layers 78–81 and includes a third generally horizontal gate layer section 105 on channel layer section 103.

As seen in FIGS. 9–12, the gate layer may comprise a plurality of spaced gate fingers such as 96 extending transversely across one or more of the edges 78–81 and spaced therefrom by semiconductor channel layer 84. The fingers are joined at a generally horizontal contact pad section 104 on substrate 71 adjacent horizontal section 99 of channel layer 84.

In FIG. 9, insulator layer 94 has a generally vertical section 106 on generally vertical section 93 of channel layer 84. Section 106 has a plurality of spaced finger-like recesses such as 95 receiving gate fingers 96 in recessed relation. In recesses 95, insulating layer 94 is removed to expose N layer 84 therebelow, and refractory metal layer 91 is deposited on the exposed portions of layer 84 in recesses 95, followed by deposition of gold overlayer 92. In the species of FIG. 11, the portions of N layer 84 between the gate fingers is completely removed.

FIG. 11 shows a normally ON device wherein depletion region spreading at zero bias does not pinch-off the channel 93.

In FIG. 10, the separation between gate fingers 96 is selected to fully deplete the N layer 84 along channel surface 93 at zero bias, and thus provide a normally OFF device wherein depletion region spreading fully pinches off the channel at zero bias.

In FIG. 12, gate fingers 96 extend over edge 78 of layer 74 and over only a portion of edge 79 of insulator layer 75.

Figure 15:
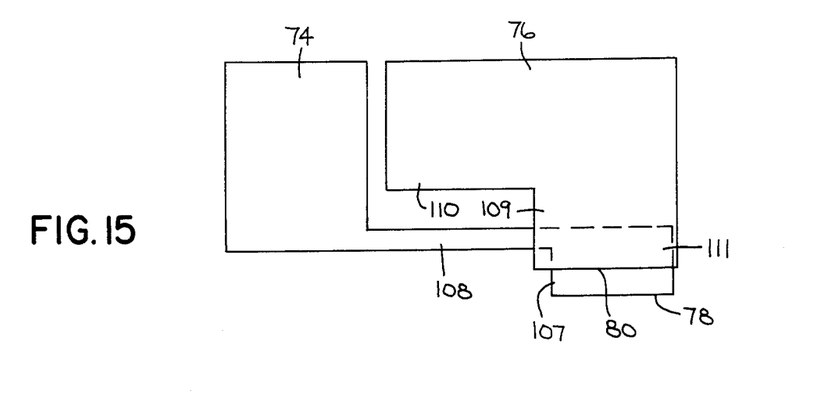
FIG. 15 is a top plan view of the structure of FIG. 14, with portions removed for clarity.
Figure 16:
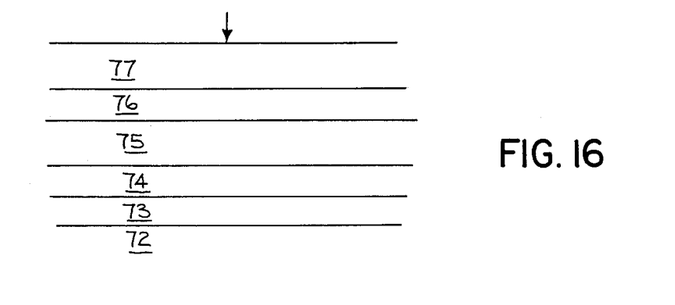
FIGS. 16–19 illustrate sequential processing steps for structural FET geometry in accordance with the invention.
Figure 17:
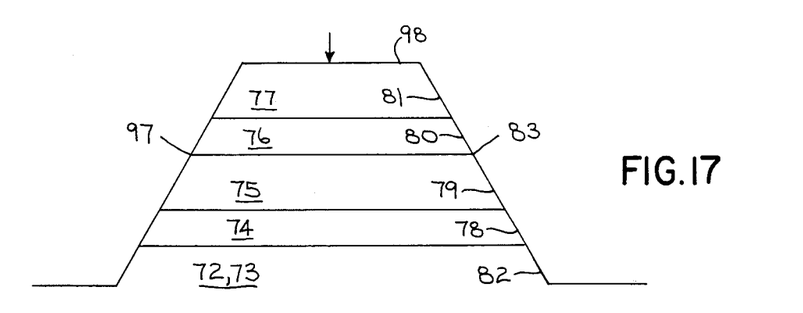
Figure 18:
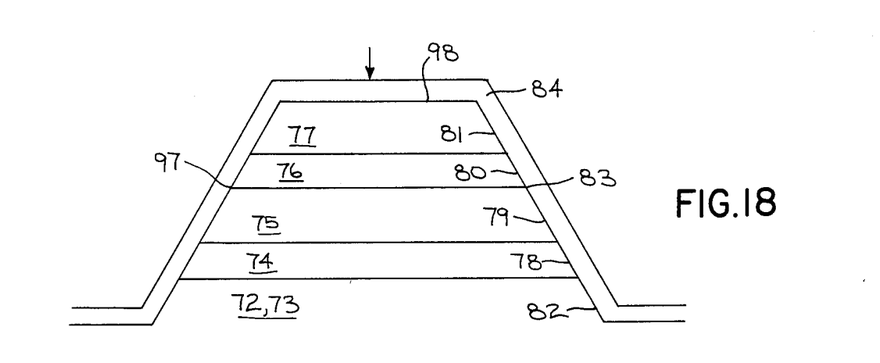
Figure 19:
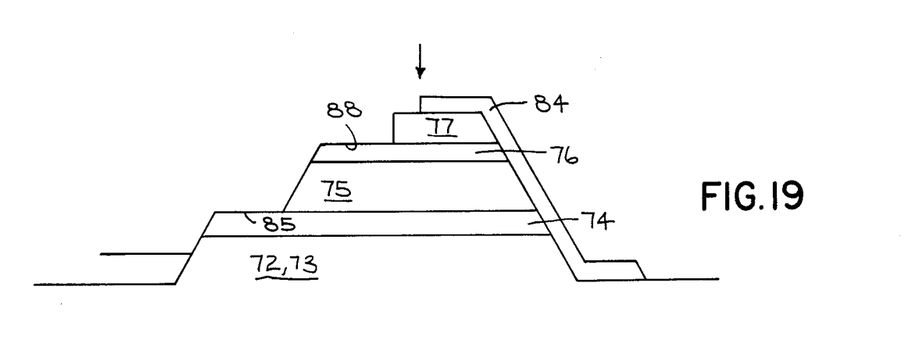

In the species in FIG. 14, semiconductor layers 74 and 76 extend from mesa side 83 in substantially horizontally offset nonoverlapping paths, for example as shown in top plan view in FIG. 15. Layer edges 78 and 80 overlap and are vertically spaced at mesa side 83 and extend away therefrom in L-shaped configuration to their respective source and drain contact areas 85 and 88. Layer 74 has an L-shape with one leg 107 and another leg 108 extending to contact area 85. Layer 76 has an L-shape with one leg 109 and the other leg 110 being formed by contact area 88. Legs 107 and 109 overlap at area 111 at their tips or edges 78 and 80 which are the exposed layer edges along the side 83 of the mesa. Legs 107 and 109 extend inwardly away from the mesa side 83 and partially overlap. Legs 107 and 109 extend perpendicularly from respective legs 105 and 107. Legs 108 and 110 do not have any portions of overlap. The noted L-shapes may be selectively deposited by molecular beam epitaxy or ion implantation or bombardment.

It is recognized that various alternatives and modifications are possible within the scope of the appended claims. Specific parameters and data have been disclosed for particular structures and technologies and are believed accurate, however the invention is not limited thereby.

I claim:

1. A field effect transistor of the type having a source, a gate and a drain, comprising:
   a substrate;
   a first generally horizontal semiconductor layer on said substrate providing one of said source and drain;
   a generally horizontal insulator layer on said first semiconductor layer;
   a second generally horizontal semiconductor layer on said insulator layer and providing the other of said source and drain;
   said layers being stacked as a mesa structure having a generally vertical side exposing the edges of said layers;
   a third semiconductor layer having a generally vertical section extending along said side of said mesa over said exposed edges of said first and second semiconductor layers and said insulator layer and providing a channel, said third semiconductor layer having a generally horizontal section on said substrate adjacent said first semiconductor layer; and
   a gate layer having a generally vertical section on at least a portion of said vertical section of said third semiconductor layer over said first semiconductor layer, said gate layer having a generally horizontal section on said horizontal section of said third semiconductor layer, said gate layer having a second generally horizontal section on said substrate.

2. The invention according to claim 1 wherein said generally vertical section of said gate layer extends only over said first semiconductor layer and a portion of said insulator layer.

3. A field effect transistor of the type having a source, a gate and a drain, comprising:
   a substrate;
   a first generally horizontal semiconductor layer on said substrate providing one of said source and drain;
   a generally horizontal insulator layer on said first semiconductor layer;
   a second generally horizontal semiconductor layer on said insulator layer and providing the other of said source and drain;
   said layers being stacked as a mesa structure having a generally vertical side exposing the edges of said layers;
   a third semiconductor layer having a generally vertical section extending along said side of said mesa over said exposed edges of said first and second semiconductor layers and said insulator layer and providing a channel, said third semiconductor layer having a generally horizontal section on said substrate adjacent said first semiconductor layer; and
   a gate layer having a generally vertical section on at least a portion of said vertical section of said third semiconductor layer over said first semiconductor layer, said gate layer having a generally horizontal section on said horizontal section of said third semiconductor layer, and wherein said gate layer comprises a plurality of spaced gate fingers extending transversely across one or more of said edges and spaced therefrom by said third semiconductor layer.

4. The invention according to claim 3 wherein said gate fingers are joined at a generally horizontal contact pad section on said substrate adjacent said generally horizontal section of said third semiconductor layer.

5. The invention according to claim 3 comprising a second insulator layer having a generally vertical section on said vertical section of said third semiconductor layer and having a plurality of spaced finger-like recesses receiving said gate fingers in recessed relation.

6. A field effect transistor of the type having a source, a gate and a drain, comprising:
   a substrate having an upper surface;
   a first N++ layer epitaxially grown on said upper surface of said substrate;
   a first insulator layer epitaxially grown on said first N++ layer;
   a second N++ layer epitaxially grown on said first insulator layer;
   a second insulator layer epitaxially grown on said second N++ layer;
   said layers being stacked as a mesa structure having a generally vertical side exposing the edges of said layers;
   an N layer extending generally vertically along said side of said mesa over said exposed edges, said N layer covering at least said first N++ layer; and
   a plurality of spaced gate fingers on said N layer extending transversely across at least one of said exposed edges and spaced therefrom by said N layer.

7. The invention according to claim 6 wherein said gate fingers are separated by a given distance to fully deplete said N layer surface at zero bias.

8. The invention according to claim 6 wherein the portions of said N layer between said gate fingers are removed.

9. The invention according to claim 6 wherein said gate fingers extend only across said first N++ layer and a portion of said first insulator layer.

10. A field effect transistor of the type having a source, a gate and a drain, comprising:
a substrate;
a first generally horizontal semiconductor layer on said substrate providing one of said source and drain;
a generally horizontal insulator layer on said first semiconductor layer;
a second generally horizontal semiconductor layer on said insulator layer and providing the other of said source and drain;
said layers being stacked as a mesa structure having a generally vertical side exposing the edges of said layers, said first and second semiconductor layers extending from said side of said mesa in substantially laterally offset nonoverlapping paths;
a third generally vertical semiconductor layer extending along said side of said mesa over said exposed edges and forming a channel.

11. The invention according to claim 10 wherein said first semiconductor layer extends horizontally beyond said first insulator layer and said second semiconductor layer, and comprising laterally offset first and second electrode layers on the upper surface of respective said first and second semiconductor layers, said first and second electrode layers being at different vertical heights spaced by the thickness of said insulator layer and said second semiconductor layer, said first and second semiconductor layers extending from respective said electrode layer areas in substantially laterally offset nonoverlapping paths.

12. The invention according to claim 11 wherein each of said first and second semiconductor layers includes an L-shaped section, the tip of one leg of the L being said exposed edge.

13. The invention according to claim 12 wherein said one leg of each L is the only area of overlap of said first and second semiconductor layers.

* * * * *